United States Patent [19]

Bonnefoy

[11] Patent Number: 4,835,658
[45] Date of Patent: May 30, 1989

[54] DEVICE FOR VENTILATING COMPONENTS ARRANGED IN ROWS ON A SUBSTRATE

[75] Inventor: Jean Bonnefoy, Crespieres, France

[73] Assignee: Bull S.A., Paris, France

[21] Appl. No.: 138,443

[22] Filed: Dec. 28, 1987

[30] Foreign Application Priority Data

Dec. 30, 1986 [FR] France ................... 86 18322

[51] Int. Cl.⁴ .............................. H05K 7/20
[52] U.S. Cl. ...................... 361/383; 165/80.3; 361/386
[58] Field of Search ............ 165/80.2, 80.3, 185; 62/418; 174/15 R, 16 R, 16 HS, 15.1, 16.1, 16.3; 357/81; 361/382–388, 395, 399, 415

[56] References Cited

U.S. PATENT DOCUMENTS

| | | | |
|---|---|---|---|
| 3,893,910 | 10/1974 | Ringuet | 361/384 |
| 4,233,644 | 11/1980 | Hwang | 361/384 |
| 4,296,455 | 10/1981 | Leacraft | 165/80.3 |
| 4,489,363 | 12/1984 | Goldberg | 361/383 |
| 4,660,123 | 4/1987 | Hermann | 361/386 |

FOREIGN PATENT DOCUMENTS 1263119 1/1964 Fed. Rep. of Germany ...... 361/383

OTHER PUBLICATIONS

Cooling Electrical Equipment, Gaunt, IBM Tech. Disc. Bul., vol. 20, No. 6, Nov. 1977, p. 2428.

Primary Examiner—Gerald P. Tolin
Attorney, Agent, or Firm—Kerkam, Stowell, Kondracki & Clarke

[57] ABSTRACT

The ventilation device (10) for components (11) disposed in rows (R1-R4) separated by corridors (C1-C5) on one face of a substrate (12) includes an inlet conduit (14) for fresh air and an outlet conduit (15) comprising two compartments (15a; 15b) each covering two rows (R1, R2; R3, R4) of components (11) and having an opening (18a; 19b) discharging into the corridor (C2; C4) separating the respective rows. The fresh air at the inlet (16) of the conduit (14) discharges into the other corridors (C1, C3, C4) such that each component (11) receives the fresh air directly. The invention thus has the advantage of effectively cooling a great number of high-power components mounted at high density on a printed circuit board, because of its simple, compact structure, which enables ventilation with less noise and with high output.

15 Claims, 2 Drawing Sheets

DEVICE FOR VENTILATING COMPONENTS ARRANGED IN ROWS ON A SUBSTRATE

FIELD OF THE INVENTION

The invention relates to a device for ventilating components disposed in rows on a substrate. It applies particularly to the cooling by ventilation of semiconductor components, such as very large scale integrated circuit packages, disposed in rows on a printed circuit board.

BACKGROUND OF THE INVENTION

Very large scale integrated circuits, also called VSLI chips, currently dissipate a major amount of heat over a small surface area. For example, N-MOS integrated circuits are capable at present of dissipating on the order of 5 watts across a surface of approximately 1 square centimeter. An N-MOS integrated circuit is a small semiconductor plate, the active components of which are N-channel metal oxide semiconductor field effect transistors, or N-MOSFETs. Each integrated circuit is assembled in a package provided with a heat exchanger in order to remove calories. The invention relates to heat exchangers including a metal-to-air interface, which are currently known as heat sinks. At the present time, a heat sink for a VSLI package is typically in the form of a solid column of material that is a good thermal conductor, provided with fins in the form of concentric rings regularly spaced along the length of the column. In complex electronic machines, such as information processing machines, the packages are connected electrically by disposing them on one or more printed circuit boards. Considering the small size sought for each VSLI package, a board may include a relatively high number of packages quite close together. The problem then becomes to remove a very large quantity of heat, concentrated on a board of small surface area, by ventilating the heat sinks.

In the prior art, cooling of the low power or less-dissipating components arranged in rows on a substrate or board is done by serial ventilation of the components of each row. The cooling device is simple, but it has the disadvantage that the last components of the row are ventilated with the air that has been heated by contact with the preceding components. Various improvements have been made, in particular an improvement in which the flow of cooling air is accelerated in proportion to how highly heated it becomes, by causing the air to pass through a conduit having a smaller and smaller cross section. With highly dissipating or high-power components, the flow of air heats very quickly from contact with the first components and is no longer suitable for cooling the following components. Thus the output of air must be increased considerably, and its speed must be increased by means of very powerful and very noisy fans. It will be appreciated, however, that the noise level must be as low as possible, especially for office information processing machines.

One solution for cooling high-caloric-dissipation components has been disclosed in French Patent No. 2 157 094, corresponding to U.S. Pat. No. 3,843,910. The principle of this solution is to ventilate each component separately with the same fresh incoming air. In one embodiment, the fresh air inlet conduit envelops the face of the substrate that carries the components, and the hot air outlet conduit covers the other face. The inflowing fresh air is thus put into direct contact with all the components and exits via holes made in the substrate so that it can be evacuated into the outlet conduit.

This embodiment has two major disadvantages. First, it is complicated to assemble the two conduits on the two respective faces of a printed circuit board. The unit is quite thick, and it becomes difficult to install it in a machine. On the other hand, it is clear that to remove powerful thermal forces requires high-powered ventilation. The holes made in the board for the passage of hot air into the outlet conduit must accordingly have a large cross section. The presence of equally large holes is to the detriment of the concentration of the printed circuits in the board and causes the loss of the advantage of being able to use boards having a small surface area. The cross section of the holes can be reduced, but smaller holes increase the resistance to the flow of air. This resistance must be compensated for by higher power on the part of the ventilation source, which thus becomes noisier. Contrarily, this embodiment is independent of the disposition of the components among one another and does not require disposition of the components in rows.

SUMMARY OF THE INVENTION

The object of the invention is to cool high-power components disposed on a board, by means of a low-noise ventilation source and a device for ventilating the components which is quite simple, is small in size, and produces effective cooling of the components by enabling a large output of air.

According to the invention, a device for ventilating components disposed in rows on a substrate, including an inlet conduit for fresh air and an outlet conduit, is characterized in that the two conduits are mounted on the same face of the substrate and discharge respectively on the two sides of at least one same row of components.

Advantageously, one of the conduits is contained within the other.

The characteristics and advantages of the invention will become apparent from the ensuing description of an exemplary embodiment, referring to the drawings.

DESCRIPTION OF THE PREFERRED EMBODIMENTS

Figure 1:
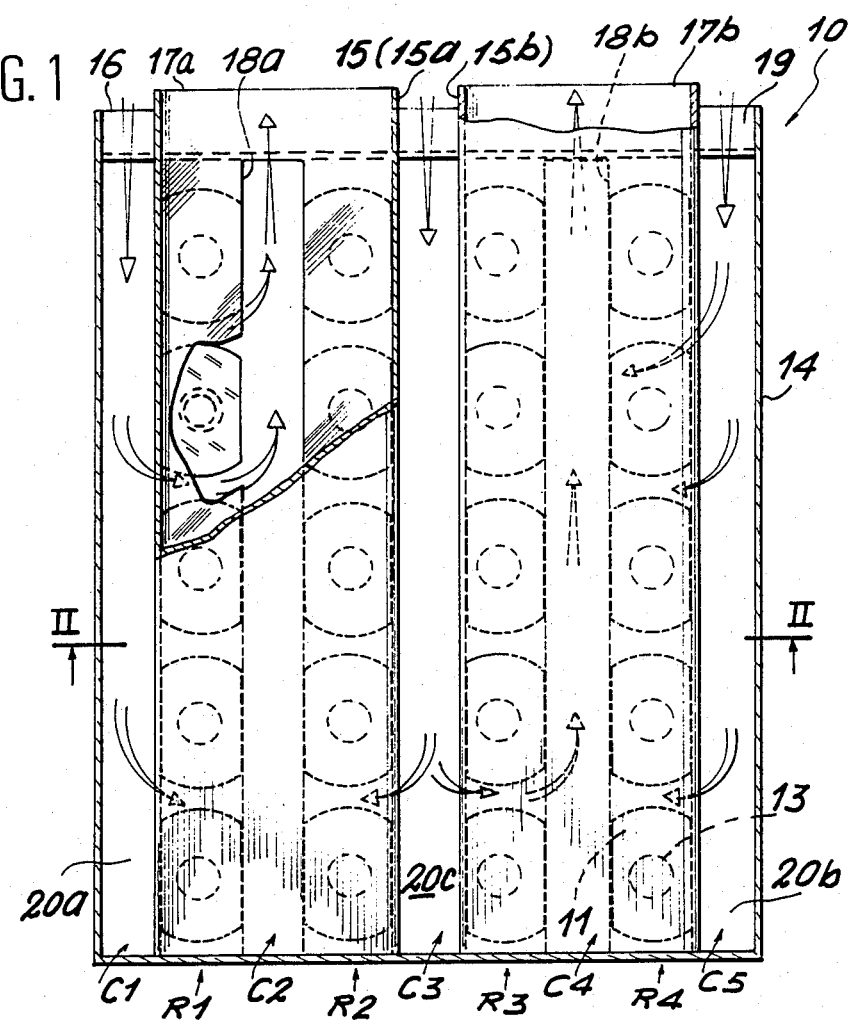
FIG. 1, in a sectional view taken along the line I—I in FIG. 2 and partially cut away, shows a ventilation device in accordance with the invention for cooling components disposed in rows on a printed circuit board.
Figure 2:
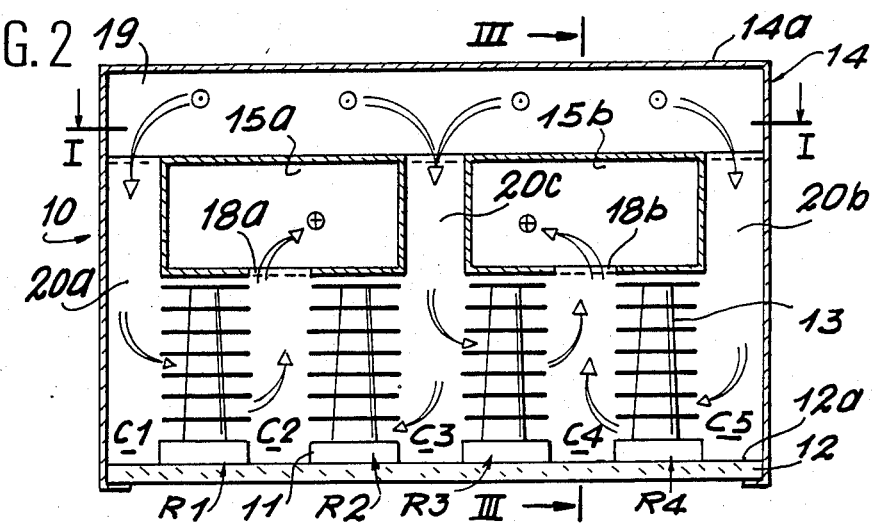
FIG. 2 is a plan view of the ventilation device of FIG. 1 taken along the line II—II.
Figure 3:
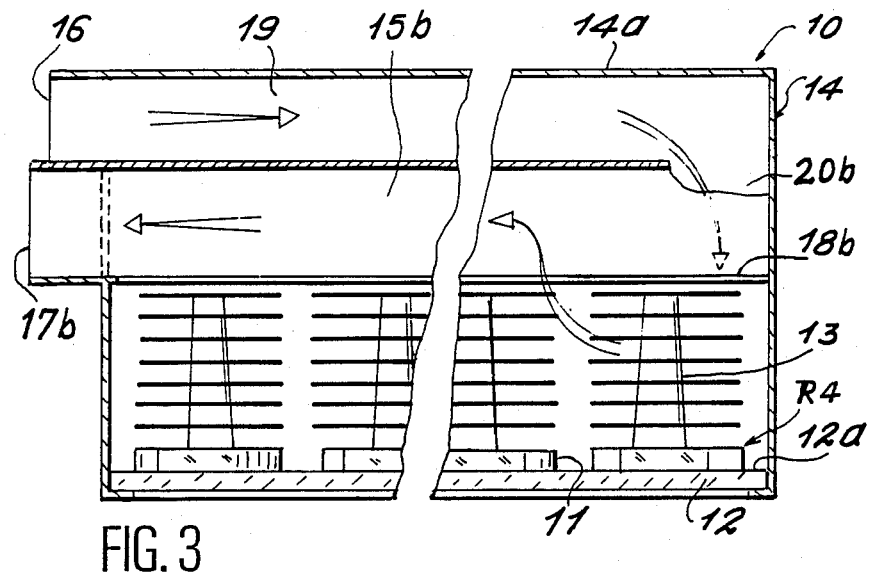
FIG. 3 shows the ventilation device along the sectional line III—III of FIG. 2 and below the partially cut-away sections.

FIGS. 1, 2 and 3 illustrate the preferred embodiment of a ventilation device 10 according to the invention for components 11 disposed in rows on the same face 12a of a printed circuit board 12. Four rows R1-R4 of components 11 are shown, which among them and with the edges of the board define five corridors C1-C5. Each of components 11 is a VLSI package provided with a heat sink 13. Each heat sink shown comprises a column provided with fins in the form of regularly spaced concentric rings. The cooling of the components 11 is thus done by ventilation of their respective heat sinks 13. In the classical manner, the ventilation device 10 includes an inlet conduit 14 for fresh air and an outlet conduit 15. The two conduits are mounted on the same face 12a of the board 12.

According to the invention, the two conduits 14, 15 discharge respectively on the two sides of at least one row of components. In the example shown, the two conduits 14, 15 discharge alternatively at the five corridors C1-C5, which respectively comprise the sides of each row R1-R4.

The inlet conduit 14 encompasses all the components 11 and with the board 12 forms a parallelepiped rectangular casing. The inlet conduit 14 shown has a rectangular fresh-air inlet 16 provided along one side of the board 12 and adjacent to the ceiling 14a of the conduit 14. The conduit 15 is contained within the conduit 14 and comprises two compartments 15a, 15b in the form of rectangular parallelepipeds which extend in the direction of the rows R1-R4 above the heat sinks 13 of the components 11. Compartments 15a, 15b traverse the inlet conduit 14 below the inlet 16 and have respective outlet openings 17a, 17b on the same side as inlet 16 for the outlet of the air from the ventilation device 10. Compartments 15a, 15b are closed on the opposite side by the wall of the inlet conduit 14. The lower face of each compartment uniformly covers the heat sinks 13 of two adjacent rows of components 11 and has a longitudinal opening along the central corridor which separates the two rows. Thus the compartment 15a covers the rows R1 and R2 of heat sinks 13, and its opening 18a discharges into the corridor C2. The compartment 15b covers the rows R3 and R4, and its opening 18b discharges into the corridor C4. The compartments 15a and 15b of the conduit 15 leave space for a chamber 19 on the upper face 14a of the conduit 14, while forming between them and with the lateral faces of the conduit 14 three channels 20a, 20b, 20c which respectively discharge into the corridors C1, C5 and C3. The side channels 20a and 20b are formed in the conduit 14 by the conduit 15 composed of all of its compartments 15a, 15b.

The arrows in FIGS. 1-3 illustrate the path taken by the cooling air transported in the device 10 according to the invention. The fresh air entering via the opening 16 of the conduit 14 spreads into the chamber 19 and is distributed among the channels 20a-20c.

The fresh air emerging from the channel 20a flows into the corridor C1 and cools each heat sink 13 of the row R1 of components 11. The hot air thus arrives at the corridor C2 and flows via the opening 18a into the compartment 15a so as to be evacuated at the outlet 17a. By symmetry, the fresh air emerging from the channel 20b flows into the corridor C5, heats up in contact with the heat sinks of the row R4, arrives in the corridor C4, and flows via the opening 18a into the compartment 15b of the conduit 15 as far as the outlet 17b. Finally, the fresh air emerging from the channel 20c flows in the corridor C3 and divides so as to ventilate the heat sinks of rows R2 and R3. The hot air is respectively recuperated in the corridors C2 and C4 and than evacuated via the compartments 15a and 15b of the outlet conduit 15. Advantageously, the cross sections of the channels 20a, 20b and 20c are adapted in such a way as to equalize the respective outputs of air.

The advantages of the ventilation device 10 according to the invention are now clearly apparent. Each component 11 of the board 12 receives the fresh inlet air. Moreover, the heat sinks 13 are ventilated in the direction of the fins, parallel to the plane of the board 12. They are thus capable of admitting a large amount of air with minimal air resistance. In conclusion, the ventilation device 10 according to the invention has the advantage of having a simple and compact structure and of cooling the components optimally and equally. This advantage is due to the ventilation of a row of components 11, which is effected perpendicular to the row and parallel to the plane of the board 12.

It will now be understood that the ventilation device 10 which has just been described can have numerous variant embodiments. For example, the heat sinks 13 may also be of some other classical type, formed by a horizontal flat substrate provided with flat parallel and vertical fins. In this case, the fins will be directed perpendicular to the row so that the air will flow easily from one corridor to another in accordance with the principles of the invention. It is also clear that the rows of components, ordinarily straight lines as illustrated here, may generally be curved or broken lines. Similarly, any other configuration for the inlet 16 and the outlets 17a and 17b can be adopted. In particular, the outlets 17a and 17b can be provided on the opposite side from that having the inlet 16, or the inlet 16 can be made in the upper face 14a of the conduit 14 along one or more openings. Moreover, it is apparent that the flow of air can be reversed, so that the compartments 15a and 15b supply the fresh air, and the conduit 14 recovers the hot air. Furthermore, the path between a fresh-air supply conduit and the adjacent opening 18 of the outlet conduit 15 can include more than one row of heat sinks, and one of the conduits 14 and 15 need not be included in the other, as is illustrated as FIG. 4.

Figure 4:
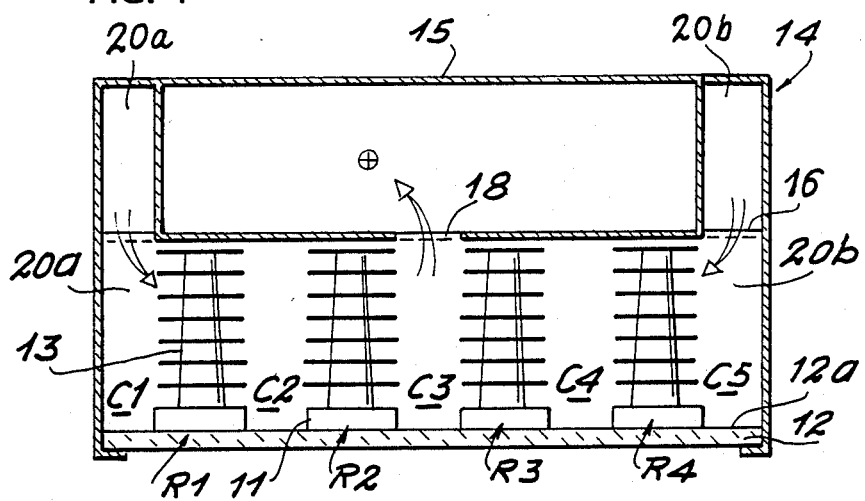
FIG. 4 is a view similar to that of FIG. 2, illustrating a variant embodiment of a ventilation device in accordance with the invention.

FIG. 4 is a view similar to that of FIG. 2, illustrating a variant embodiment of a ventilation device 10 according to the invention. Similar elements in these two drawing figures are identified by the same reference numerals. In the ventilation device 10 shown in FIG. 4, the outlet conduit 15 is carried by the inlet conduit 14 and in this conduit forms two channels 20a, 20b. The conduit 14 has one fresh-air inlet 16, leading directly to the two channels 20a, 20b which are parallel to the four rows R1-R4 of components 11 and discharge into the two outermost corridors C1 and C5. The conduit 15 is placed between the two channels 20a, 20b. It covers the four rows R1-R4 and evacuates at 18 along the central corridor C3. Thus, the two conduits 14 and 15 respectively direct airflow between the two corridors (C1, C3; C5, C3) each surrounding two rows (R1, R2; R3, R4) of components 11. The fresh air emerging from the channel 20a traverses the two rows R1, R2 of components 11 before entering the conduit 15 through slot 18. Similarly, the fresh air emerging from the channel 20b cools the rows R3, R4 of components 11. In this variant of the ventilation device 10 according to the invention, it can be seen that the channels 20a and 20b can be omitted or displaced in such a manner that the inlet 16 will be placed along lateral walls of the conduit 14, at the level of the heat sinks 13 and along approximately the same height.

What is claimed is:

1. A ventilation device (10) for cooling a structure, said structure comprising a plurality of components (11) arranged in rows (R1-R4) separated by respective corridors (C2, C3, C4) on a first face (12a) of a board (12), said components having fins extending perpendicularly to said rows, the ventilation device comprising a first and a second conduit adapted to provide an air inlet and an air outlet, said first conduit (14) enveloping all of said components on said face of the board and forming a first and a second additional corridor (C1, C5) with a first and a second outermost row of said components, and having opening means for permitting passage of air (16), said second conduit (15) being contained within the first conduit, said second conduit further being disposed above the rows of components, and having external opening means (17) and internal opening means (18; 18a, 18b) for permitting passage of air therethrough, said internal opening extending along at least one intermediate corridor (C3) of said rows.

2. The device as defined by claim 1, wherein said first and second conduits have respective ceiling sidewalls (14a, 15a) forming a chamber (19).

3. The device as defined by claim 1, wherein said first and second conduits have a common ceiling external sidewall.

4. The device as defined by claim 1, wherein said first and second conduits have respective lateral sidewalls forming channels (20a, 20b) above said first and second additional corrlidors (C1, C5).

5. The device as defined by claim 1, wherein said opening means (16) of the first conduit (14) and said external opening means of the second conduit (15) are disposed in a perpendicular orientation to said rows.

6. The device as defined by claim 1, wherein said opening means (16) of the first conduit (14) is disposed along said first and second additional corridors (C1, C5) and said opening means (17) of the second conduit (15) is disposed in a perpendicular orientation to said rows.

7. The device as defined by claim 1, wherein said second conduit (15) comprises at least two compartments (15a, 15b) each extending above at least two adjacent rows (R1, R2; R3, R4) and having internal opening means (18a, 18b) along an intermediate corridor (C2, C4) of said at least two rows, two adjacent compartments being separated from each other by a channel (20c) extending above a corridor (C3) other than said intermediate corridors and communicating with said opening means (16) of the first conduit.

8. The device as defined by claim 1, wherein said fins form a heat sink (13) for each of said components (11) and said fins extend parallel to said face (12a) of the board (12).

9. The device as defined by claim 1, wherein said fins form a heat sink (13) for each of said components (11) and said fins extend perpendicularly to said face (12a) of the board (12).

10. A ventilation device (10) for cooling a structure, said structure comprising a plurality of components (11) arranged in rows (R1-R4) separated by respective corridors (C2, C3, C4) on a first face (12a) of a board (12), said components having fins extending perpendicularly to said rows, the ventilation device comprising a first and a second conduit for air inlet and outlet, said first conduit (14) enveloping all of said components on said face of the board and forming a first and a second additional corridor (C1, C5) with a first and second outermost row of said components, and having opening means (16) on a sidewall perpendicular to the rows for permitting passage of air, said second conduit (15) being contained within the first conduit and made of at least two compartments (15a, 15b), each extending above at least two adjacent rows (R1, R2, R3, R4) and having external opening means (17a, 17b) extending perpendicularly to the rows and internal opening means (18a, 18b) extending along an intermediate corridor (C2, C4) of said at least two adjacent rows, a first and a second adjacent ones of said compartments being separated from each other by a channel (20c) extending above a corridor (C3) other than said intermediate corridors and communicating with said opening means (16) of the first conduit, and a first and a second outermost compartment having lateral sidewalls forming, with an associated adjacent lateral sidewall of the first conduit, a channel (20a, 20b) above said first and second additional corridors.

11. A ventilation device as defined in claim 10, wherein said compartments define, under a ceiling sidewall (14a) of the first conduit, a chamber (19) communicating with said opening means (16) of said first conduit.

12. A ventilation device as defined by claim 10, wherein said compartments have common sidewalls with a ceiling sidewall (14a) of the first conduit.

13. A ventilation device as defined by claim 10, wherein said fins form a heat sink (13) for each of said components (11) and said fins extend parallel to said face (12a) of the board (12).

14. A ventilation device as defined by claim 10, wherein said fins form a heat sink (13) for each of said components (11) and said fins extend perpendicularly to said face (12a) of the board (12).

15. A ventilation device for cooling a structure, said structure comprising a plurality of components arranged in rows, said rows separated by corridors on a first face of a substrate, said components having heat conductive fins extending perpendicularly to said rows, the ventilation device comprising a first and a second conduit means for directing airflow, said first and second conduit means adapted to provide an inlet and an outlet for air, said first conduit means surrounding all of said components disposed on said substrate, said first conduit means further forming, with a first and second outermost row of said components, a first and a second outer corridor, said first conduit means further having opening means for passage of air therethrough, said second conduit further being disposed above the rows of said components, and having external opening means and internal opening means for passage of air therethrough, said internal opening extending along and being in communication with at least a first intermediate corridor between said rows.

* * * * *

UNITED STATES PATENT AND TRADEMARK OFFICE
CERTIFICATE OF CORRECTION

PATENT NO. : 4,835,658

DATED : May 30, 1989

INVENTOR(S) : BONNEFOY

It is certified that error appears in the above-identified patent and that said Letters Patent is hereby corrected as shown below:

In Col. 5, line 24, (claim 4, line 4), "corrlidors" should be --corridors--.

Signed and Sealed this

Tenth Day of April, 1990

Attest:

HARRY F. MANBECK, JR.

*Attesting Officer*    *Commissioner of Patents and Trademarks*